Oct. 29, 1968 K. H. REISSMUELLER ETAL 3,408,271
ELECTROLYTIC PLATING OF METAL BUMP CONTACTS TO SEMICONDUCTOR
DEVICES UPON NONCONDUCTIVE SUBSTRATES
Filed Dec. 6, 1965 4 Sheets-Sheet 1

INVENTORS.
KARL H. REISSMUELLER,
RALPH E. ALEXANDER,
MANFRED W. REISSMUELLER,
BY
W H MacAllister Jr
ATTORNEY.

Oct. 29, 1968 K. H. REISSMUELLER ET AL 3,408,271

ELECTROLYTIC PLATING OF METAL BUMP CONTACTS TO SEMICONDUCTOR DEVICES UPON NONCONDUCTIVE SUBSTRATES

Filed Dec. 6, 1965 4 Sheets-Sheet 2

United States Patent Office 3,408,271

Patented Oct. 29, 1968

3,408,271

ELECTROLYTIC PLATING OF METAL BUMP CONTACTS TO SEMICONDUCTOR DEVICES UPON NONCONDUCTIVE SUBSTRATES

Karl H. Reissmueller and Ralph E. Alexander, Tustin, and Manfred W. Reissmueller, Costa Mesa, Calif., assignors to Hughes Aircraft Company, Culver City, Calif., a corporation of Delaware Continuation-in-part of application Ser. No. 435,918, Mar. 1, 1965. This application Dec. 6, 1965, Ser. No. 511,780

11 Claims. (Cl. 204—15)

This is a continuation-in-part of application Serial No. 435,918 filed March 1, 1965, and now abandoned, by the same inventors and assigned to the instant assignee.

This invention relates to a method of forming electrical contacts in the form of metallic bumps to semiconductor devices such as transistors, for example, for subsequent connection to lead wires and the like.

Considerable difficulty is encountered in making low-resistance nonrectifying contacts to solid state circuit elements or semiconductor devices especially such as those employed in integrated and microelectronic circuits. For such applications, the size of such contacts is often well within the microscopic range and may be as small as ten microns in diameter. Hence the shaping and exact alignment of such contacts is a tedious and extremely exacting procedure.

Accordingly, it is a primary object of this invention to provide a convenient, low-cost method for making low resistance, nonrectifying contacts to soild state circuit elements, including active and inactive components such as transistors and resistors, respectively.

A specific embodiment of the invention will be described with reference to the accompanying drawings, wherein.

Figure 1:
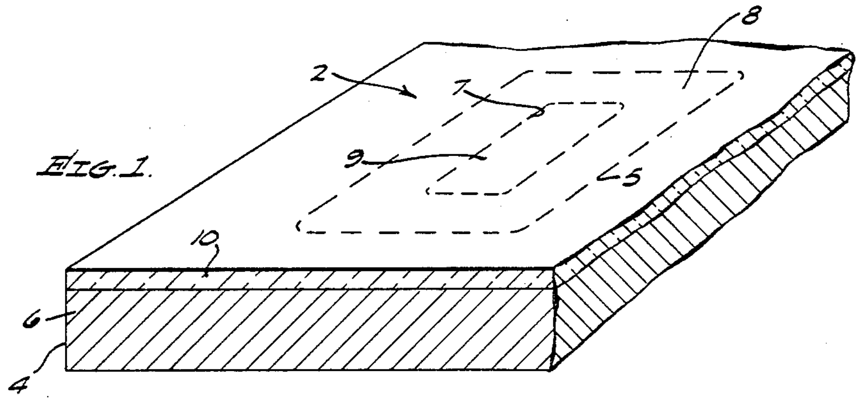
FIGURE 1 is a pictorial representation, partly in section, of a portion of a semiconductor wafer in which a transistor device has been fabricated.
Figure 2:
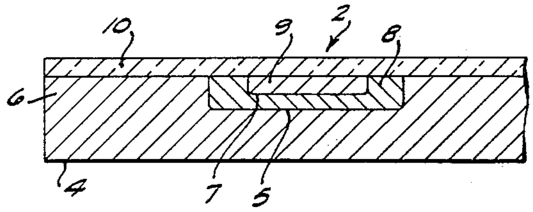
FIGURE 2 is an elevational view in section of the transistor device portion of the semiconductor wafer shown in FIGURE 1.

With reference to FIGURES 1 and 2, a semiconductor transistor device 2 is shown which has been fabricated in a semiconductor wafer or body 4 according to techniques well known in the art. It will be understood that many hundreds of such transistor devices are customarily made on a relatively large semiconductor wafer or body 4 by means of oxide-masking and diffusion techniques well known in the art and amply described in U.S. Patent Numbers 2,802,760 to Derick et al. and 3,025,589 to Hoerni. After fabrication of the transistor devices, the semiconductor body 4 is then sliced up so as to provide a plurality of discrete transistor devices. Thus, it will be appreciated that, while the description of the practice of the process of the present invention is with respect to only one transistor device, actually the process of the invention is practiced upon a semiconductor wafer 4 containing many hundreds of such devices prior to slicing the wafer to yield discrete devices. It is, of course, within the scope of the present invention to practice the process thereof on only a single device if desired. Also, while the process of the present invention is described herein with particular reference to forming electrical contacts on or to a transistor device, the invention may be practiced to equal advantage in the fabrication of semiconductor diodes or other electrical components.

In FIGURES 1 and 2, a body 4 of silicon, for example, is shown, the bulk of which constitutes a collector region 6. By means of the aforementioned masking and diffusion techniques, a diffused base region 8 is disposed on a surface of the silicon body 4 and a diffused emitter region 9 is disposed in the base region 8 on the same surface of the semiconductor body 4. It will be understood that by forming the collector region 6 and the base and emitter regions 8 and 9, respectively, of different conductivity types of semiconductor material, a rectifying collector-base junction 5 will be formed between the collector region 6 and the base region 8 and a base-emitter junction 7 will be formed between the base and emitter regions 8 and 9, respectively. The junctions 5 and 7 extend to the same surface of the silicon body 4. In order to protect this surface and these rectifying junctions, a layer 10 of insulating material is disposed over the entire surface of the silicon body 4. The insulating layer 10 may be glass, for example, or an oxide of the material constituting the semiconductor body 4, such as silicon oxide. Portions of this oxide layer 10 may be formed of the oxide-mask utilized to fabricate the base and emitter regions 8 and 9, respectively, and left in place. It is customary after forming the emitter region 9 by diffusion to oxidize the exposed surface of this region so that the entire surface of the semiconductor body 4 is protected before and while awaiting further processing. It is also within the scope of the present invention to apply additional insulation over the masking oxide layer which insulation may be pyrolytically-deposited silicon oxide or glass, for example. Reference numeral 10 is therefore intended to indicate generically all such types and forms of surface-protecting insulation. At this stage of fabrication, it is thus necessary to provide openings through the protective insulating layer 10 to the base and emitter regions 8 and 9 in order to provide electrical connections to these regions. Connection to the collector region 6 through the insulating layer 10 is optional depending upon the ultimate circuit design incorporating the transistor device. Thus electrical connection to the collector region 6 may be provided to the opposite or "back" side of the semiconductor body 4 with respect to the surface containing the base and emitter regions. In some circuit designs, however, it is desired to have all device connections on the same surface of the device body. Hence it is within the practice of the present invention to provied an opening through the insulating layer 10 over the collector region 6 to permit such a "top" surface connection thereto. It should also be understood that it is desirable for transistor devices of the planar type to provide the immediate or direct connections from the circuit leads, for example, to areas of the transistor device surface other than to the areas of the base and emitter regions 8 and 9 themselves because of their small size. Hence, intermediate connection strips from the base and emitter regions 8 and 9 are usually provided over the protective insulating layer 10 to surface areas of the semiconductor body 4 where sufficient space is available on which rugged or "beefed up" contacts may be formed for circuit connection purposes. Since the base region 8 surrounds the emitter region 9, it is necesary that there be a gap in the connection means to the base region 8 in order to permit a connection strip from the emitter region 9 to be brought out to such contact areas or "pads," as these areas will be hereinafter called, and that the insulation layer 10 covering this gap portion 11 (see FIGURE 3) be left in place so that the emitter connection strip is electrically isolated from the base region 8.

Figure 3:
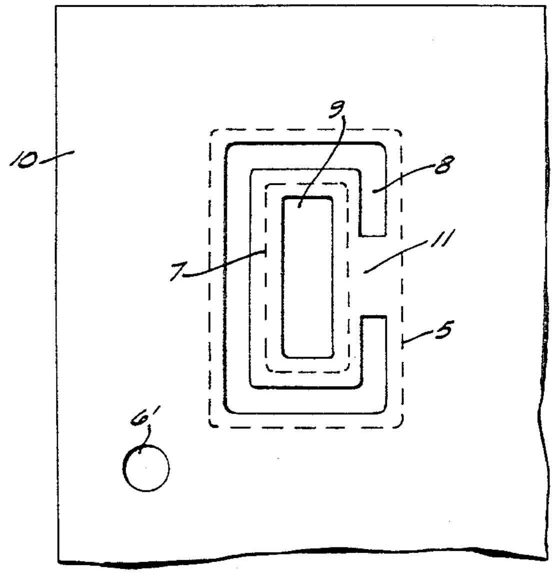
FIGURE 3 is a plan view of the transistor device portion of the semiconductor wafer shown in FIGURES 1 and 2 at a further stage in the processing thereof according to the invention.

With particular reference to FIGURE 3, the first step in the practice of the present invention is to expose the surfaces of the base and emitter regions 8 and 9 and the collector region 6 if such top contact thereto is desired in order to permit electrical connections to be made to these regions of the transistor device 2. By means of photoresist and etching procedures will known in the art, the openings to these regions are provided through the insulating layer 10 as shown in FIGURE 3. After the surfaces of these regions have been exposed, the photoresist material is then removed from the surface of the semiconductor body 4. It will be noted that the unopened portion to the base region 8 provides a bridge 11 of the insulating material 10 over this portion of the base region. Thus it will be understood that this portion as well as the junctions 5 and 7 and the entire surface of the semiconductor body 4 except for the openings to the base, emitter and collector regions are covered with the insulating layer 10. Thereafter, a metal such as silver, for example, is vapor-deposited over the entire surface of the semiconductor body 4 to a thickness of about 6000 A. It will be understood that this metal layer is deposited in direct contact with the exposed surfaces of the collector (through the collector contact hole 6') and to the exposed surfaces of the base and emitter regions 8 and 9. The metal contacts thus provided to the collector region 6 and to the base and emitter regions 8 and 9 are identified in the drawings as collector contact 6', base contacts 8' and emitter contact 9', respectively.

Figure 4:
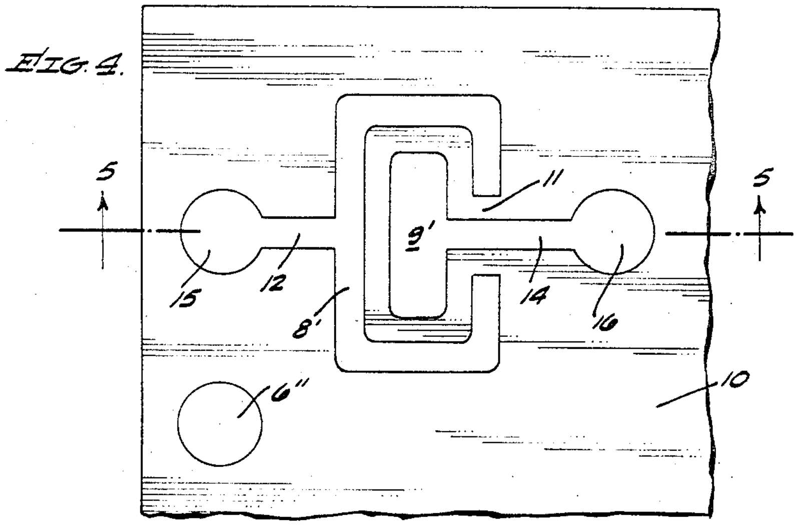
FIGURE 4 is a plan view of the transistor device portion of the semiconductor wafer shown in FIGURE 3 at still another stage in the processing thereof according to the invention.
Figure 5:
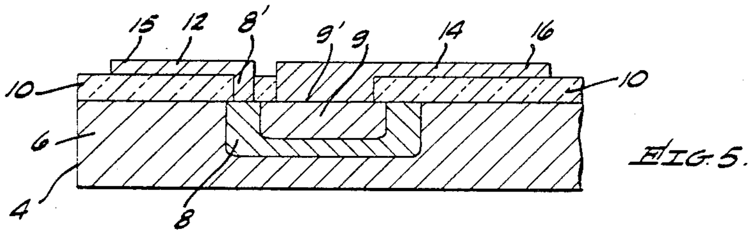
FIGURES 5 through 9 are elevational views in section of the transistor device portion of the semiconductor wafer shown in the previous figures and illustrating further successive steps in the processing thereof according to the invention.

With particular reference now to FIGURES 4 and 5, the metal layer applied in the foregoing step is removed everywhere by photoresist and etching techniques except as shown. Thus portions 6', 8' and 9' of this metal are retained in contact with the exposed portions of the collector, base and emitter regions 6, 8 and 9, respectively. In addition, portions of this metal are retained to form connecting strips 12 and 14 as a continuous extension of the metal contacts 8' and 9' on the exposed base and emitter regions 8 and 9, respectively. The metal is also retained to form the base and emitter contact pads 15 and 16 as a continuation of the connecting strips 12 and 14. Thus, except for the exposed portions of the collector, base and emitter regions themselves, the metal constituting the connecting strips 12 and 14 and the contact pads 15 and 16 is disposed over the insulating layer 10 with the emitter connecting strip 14 extending over the bridge 11 of this insulating layer through the gap provided in the base contact 8'.

Figure 6:
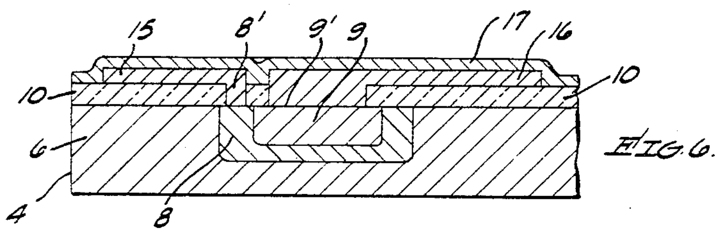

With reference now to FIGURE 6, the next step in the proces of the invention is to vapor-deposit a metal layer 17 over the entire surface of the semiconductor body 4 including the metal contacts, connecting strips and pads formed in the previous step. This metal layer 17 may be of silver and is deposited to a thickness of about 1000 A.

Figure 7:
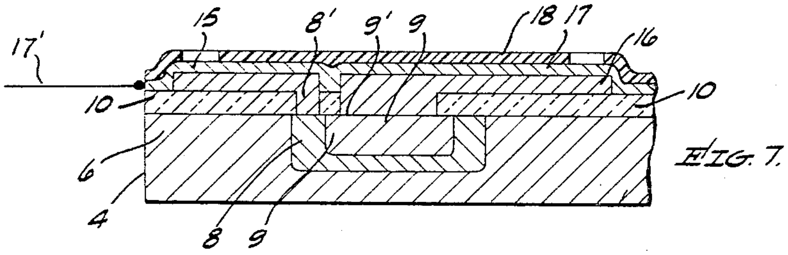
Figure 8:
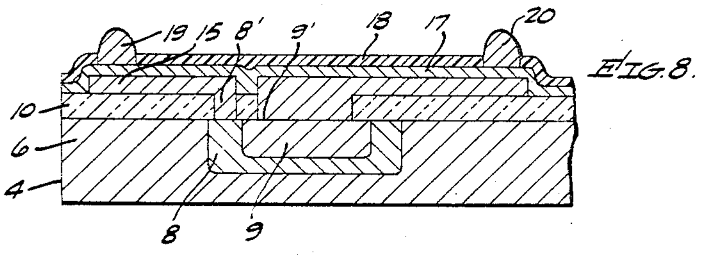

The next step is to apply a photoresist layer 18 over the metal layer 17 and then expose the base and emitter pads portions 15 and 16 of the metal layer 17 through openings in the photoresist film or layer 18 as shown in FIGURE 7. The collector contact 6' may also be exposed through the photoresist layer 18 if a top surface connection to the collector region 6 is desired. The entire semiconductor body is then immersed in an electroplating bath while utilizing the metal layer 17 as the cathode connection in the plating circuit. The plating metal may be silver, for example. The plating connection 17' to the metal layer 17 is shown schematically in FIGURE 7. It will thus be appreciated that the metal layer 17 is utilized to provide the necessary electroplating connection to permit the simultaneous formation of relatively large rugged circuit contacts or bumps 19 and 20 to the contact pad portions 15 and 16 of a large number of transistor devices in the wafer or semiconductor body 4 in order to provide the necessary electroplating current continuity to all such contacts. Thus, as shown in FIGURE 8, at the completion of this plating step, metal bumps 19 and 20 have been formed in contact with the base and emitter pads 15 and 16, respectively. These bumps 19 and 20 may have a height of about 3 mils. It should also be understood that a similar metal bump 6''' may be formed at the same time to the collector contact 6' where such top surface connection is desired.

Figure 9:
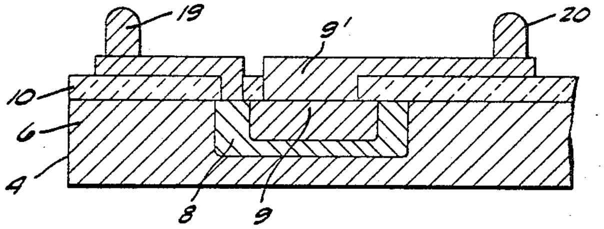
Figure 10:
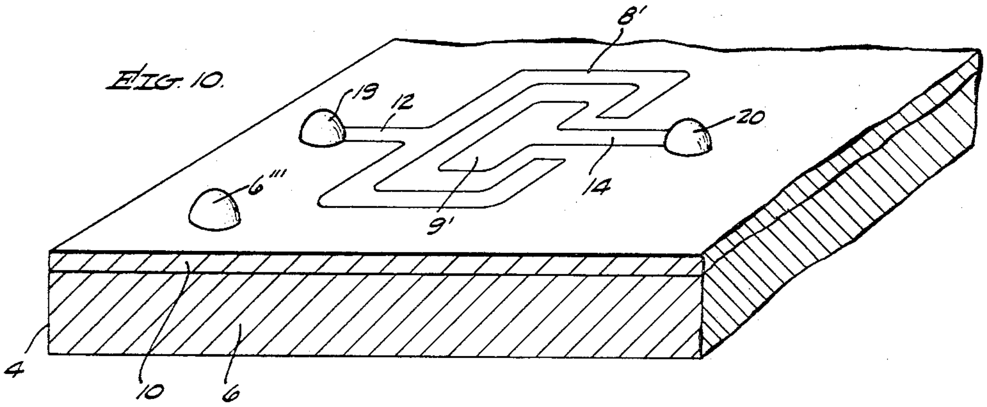
FIGURE 10 is a pictorial representation, partly in section, of a completed transistor device portion of the semiconductor wafer shown in the preceding figures.

With reference now to FIGURE 9, the photoresist film 18 and the electroplating connection layer 17 are now removed by a simple etching technique or by a high velocity water spray leaving the structure shown in FIGURES 9 and 10. The completed device shown in these figures corresponds substantially to the structures shown in FIGURES 4 and 5 except for the addition thereto of the metal bumps 19 and 20 (and the collector bump 6''', if desired). Thus, except for where contact is made to the base, emitter and collector portions, the entire surface of the semiconductor body 4 is covered with the protective insulative layer 10. By the process of the present invention, the junctions once formed under the insulating layer 10 are never exposed. Thus, notwithstanding the fact that one surface of the semiconductor body 4 is electrically nonconducting, the method of the invention permits selected portions of this surface to be electroplated to form the large solderable bump contacts 19 and 20.

Although the method of the invention was illustrated and described hereinabove with reference to the use of a silicon wafer or substrate, it will be understood that germanium or other semiconductor or electrically nonconductive substrates such as glass can be used in accordance with the method of the invention.

While in the foregoing description the use of vapor-deposited silver to form the contacts to the active regions of the transistor devices as well as the connecting strips and pads has been described, the practice of the invention is not limited to the use of silver for this purpose. It has also been found that a multiple metallic layer system for these contacts, connecting strips and pads has some advantages. Thus, it has been found useful to first deposit chromium on the exposed areas of the semiconductor body because of its excellent adherence to both the silicon body portions as well as the insulating layer, especially when this insulating layer is silicon oxide. Next, aluminum is vapor-deposited onto the chromium portions somewhat after the time that the chromium evaporation was started so that these two evaporations overlap to a certain extent. After the chromium evaporation has ceased, the aluminum evaporation is continued and before the aluminum evaporation is terminated, silver is vapor-deposited over the aluminum portions after which the aluminum evaporation is terminated. The use of this multiple layered contact solves some of the problems that result when only one metal is used. Thus, while chromium adheres well to silicon and silicon oxide, as mentioned previously, its electrical resistance is undesirably high; hence, the reason for incorporating aluminum. On the other hand, aluminum has too high a eutectic in many instances and the high temperatures necessary might be detrimental to the device when making solder connections; hence, the desirability of depositing silver over the aluminum. It will be understood that, as empolyed in the specification and the following claims, the term "metallic layer" is intended to means either one or more layers of metal.

The electroplating connection layer 17 is formed of evaporated silver particularly because silver, while being an excellent electrical conductor, does not stick or adhere too well to the insulating layer or silicon oxide. Thus, the silver electroplating layer 17 is readily removable after the electroplating step has been completed to build up the silver bumps. The excellent electrical conductivity properties of silver are advantageous in the electroplating step and its loose adherence to the oxide is advantageous in permitting its removal.

While the process of the invention has been taught as employing two separate metal vapor-deposition steps, it is also within the scope of the invention to utilize only a single metal vapor-deposition procedure. Thus, the first deposited metal layer could also be used as the electroplating connection layer for the formation of the bumps. In such an alternative procedure, the base and emitter contacts and their connector strips as well as the pads therefor and an interconnecting grid network are formed by geometry-etching the deposited metal. The metal pattern thus formed is covered everywhere with additional photoresist or electrically insulating material with openings being left therein only where it is desired to form the bumps. The interconnecting grid network is then employed as a plating connection so that the bumps may be formed by electroplating as described previously. Thereafter, the interconnecting grid network is either removed or cut so as to be discontinuous. This may be accomplished by etching, scribing or even dicing the wafers when obtaining the discrete devices therefrom.

Figure 11:
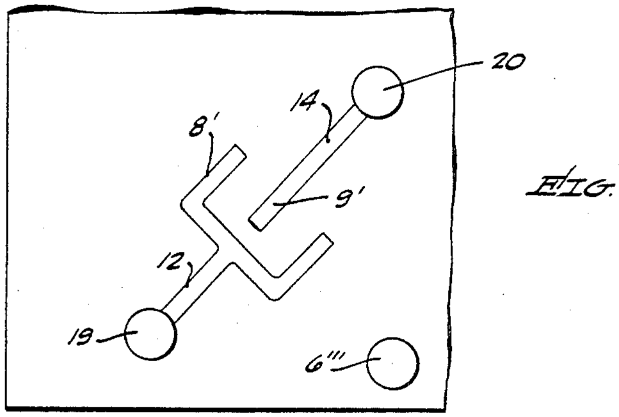
FIGURES 11 and 12 are plan views of transistor devices fabricated according to the invention having alternative base and emitter region geometries.
Figure 12:
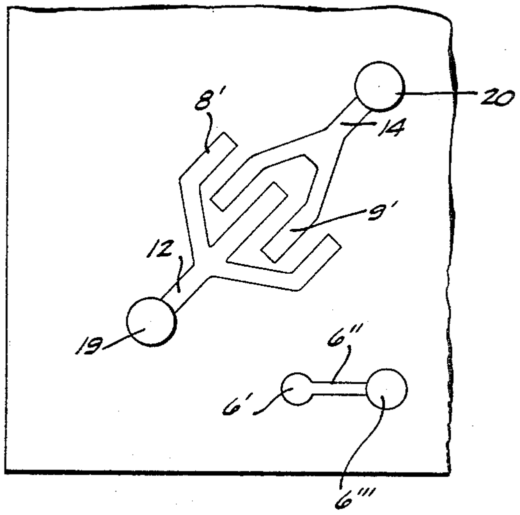

While the invention has been described with respect to a particular transistor geometry, it will be understood that other geometries may be utilized as illustrated in FIGURES 11 and 12. Thus, in FIGURE 11, instead of using a nearly closed C-shaped base contact, a simpler C shape may be employed. In FIGURE 12, the base contact 8' is in the form of a trident, for example, while the emitter contact 9' is formed into two branches which extend into and between the branches of the base contact in an interdigitated fashion. Finally, it is also possible to achieve certain advantages by forming a contact pad for the collector connection as shown in FIGURE 12. In this instance, the contact to the collector region is made as described before. This contact 6' is then provided with a continuous metallic connecting strip 6'' to a contact pad on which a collector bump 6''' is electroplated. Both the collector connecting strip and the collector contact pad are disposed over the oxide or insulating layer 10 just as the connecting strips and the base and emitter contact pads are. One reason for doing this is that it has been found that stronger bonds can be formed between a metal contact bump and a relatively large area contact pad which is over the insulating or oxide layer than forming the bump directly to an exposed collector portion 6 of the semiconductor body 4.

While, except for the collector contact bump, the practice of the invention has been taught for forming metal bumps over an insulated protective surface of a device, the practice of the invention is not necessarily limited to forming the bumps over an insulating layer. That is, if the device parameters themselves, such as the areas of the base and emitter regions, are large enough, the bumps may be formed directly on these regions.

Upon the completion of the process steps described, it may be desirable to provide the "bump contacts" with a coating of solderable metal. This may be accomplished by covering the entire surface of the semiconductor body prior to dicing into discrete devices with a coating of nonmetallic or insulating material which may be either permanently or temporarily bonded to the surface while leaving the "bumps" protruding therethrough. The surface of the semiconductor body on which the bumps are located may then be partially immersed in a dip solder bath, thus providing these bumps with a layer of solder thereon of desired thickness.

Obviously many other modifications and variations of the present invention are possible in the light of the above teachings. It is therefore to be understood that within the scope of the appended claims the invention can be practiced otherwise than as specifically described.

What is claimed is:

1. The method of providing an electronic component with an electroplated electrical connection to said component comprising the steps of:

(a) depositing an electrically conductive coating entirely over a surface of said electronic component including any electrically insulated portions of said surface;
(b) removing portions of said coating to form said coating into an electrically continuous predetermined pattern on said surface of said component including any electrically insulated portions of said surface;
(c) forming a mask of electrically nonconductive material on said surface of said component and over said electrically continuous pattern;
(d) opening a window in said mask to expose at least one preselected portion of said electrically continuous pattern;
(e) electroplating said preselected exposd portion of said electrically continuous pattern with a metal deposited through said window in said mask by employing said pattern as a plating electrode to form an electroplated metallic body on said preselected portion of said pattern;
(f) and removing further portions of said pattern to thereby electrically isolate said metallic body which is in electrical contact with said preselected portion of said pattern from the remaining portions of said pattern.

2. The invention according to claim 1 wherein said preselected exposed portion of said pattern is disposed over an electrically insulated portion of said surface of said component.

3. The invention according to claim 1 wherein said preselected exposed portion of said pattern is disposed in electrically conducting relationship with a portion of said surface of said component.

4. The invention according ot claim 1 wherein said electronic component is a semiconductor device having an electrically insulated coating on the surface thereof with an opening through said insulated coating exposing a portion of said surface.

5. The invention according to claim 4 wherein said preselected exposed portion of said pattern is disposed over an electrically insulated portion of said surface of said surface of said semiconductor device.

6. The invention according to claim 4 wherein said preselected exposed portion of said pattern is disposed over and in electrical contact with said exposed portion of said surface of said semiconductor device.

7. The method of providing an electroplated electrical connection to a surface of a semiconductor device having an electrically insulating coating on said surface comprising the steps of:

(a) opening a window in a portion of said insulating coating to expose a portion of said surface of said semiconductor device;
(b) depositing a first metallic coating over said insulating coating and on said exposed surface portion of said semiconductor device through said window;
(c) selectively removing portions of said first metallic coating to form said first metallic coating into a predetermined metallic pattern over said insulating coating and in electrical contact with said exposed surface portion of said semiconductor device through said window;
(d) depositing a second metallic coating over said insulating coating and said metallic pattern;
(e) forming a mask of electrically nonconducting material on said second metallic coating;
(f) opening a window in said mask to expose a preselected portion of said second metallic coating superimposed over a portion of metallic pattern;
(g) electroplating said preselected portion of said second metallic coating with a metal deposited through said window in said mask by employing said second metallic coating as a plating electrode;

(h) and removing said mask and said second metallic coating to thereby expose said predetermined metallic pattern with an electroplated metallic body in contact therewith at said preselected portion thereof.

8. The invention according to claim 7 wherein the portion of said metallic pattern over which said exposed portion of said second metallic coating is disposed overlies a portion of said insulating coating.

9. The invention according to claim 7 wherein said electroplated metal is silver.

10. The invention according to claim 8 including the step of providing only said electroplated metallic body with a further coating of solderable metal.

11. The invention according to claim 1 wherein said electrically conductive coating comprises a metallic layer.

References Cited

UNITED STATES PATENTS

| | | | |
|---|---|---|---|
| 2,834,723 | 5/1958 | Robinson | 204—15 |
| 2,861,029 | 11/1958 | Bain et al. | 204—15 |
| 3,188,251 | 6/1965 | Straight et al. | 204—15 |
| 3,208,921 | 9/1965 | Hill | 204—15 |
| 3,253,320 | 5/1966 | Levi-Lamond | 204—15 |

JOHN H. MACK, *Primary Examiner.*

T. TUFARIELLO, *Assistant Examiner.*